(12) United States Patent
Kang et al.

(10) Patent No.: US 7,727,877 B2
(45) Date of Patent: Jun. 1, 2010

(54) METHOD OF MANUFACTURING A WAFER LEVEL PACKAGE THAT USES THE SAME SEED LAYER FOR SELECTIVELY ELECTROPLATING A REWIRING PATTERN AND A CONDUCTIVE PILLAR

(75) Inventors: Joon-Seok Kang, Suwon-si (KR); Sung Yi, Suwon-si (KR); Jong-Hwan Baek, Seoul (KR); Young-Do Kweon, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 43 days.

(21) Appl. No.: 12/149,014

(22) Filed: Apr. 24, 2008

(65) Prior Publication Data
US 2009/0124075 A1 May 14, 2009

(30) Foreign Application Priority Data
Nov. 8, 2007 (KR) ...................... 10-2007-0113931

(51) Int. Cl.
*H01L 21/445* (2006.01)
(52) U.S. Cl. ...................... 438/614; 438/615; 438/674; 257/E21.586
(58) Field of Classification Search ................. 438/677
See application file for complete search history.

(56) References Cited

U.S. PATENT DOCUMENTS 7,202,156 B2 * 4/2007 Saiki et al. .................. 438/622

2005/0040543 A1 * 2/2005 Watanabe .................... 257/781

FOREIGN PATENT DOCUMENTS

| JP | 6-333931 | 12/1994 |
| JP | 2001-244287 | 9/2001 |
| JP | 2005-64473 | 3/2005 |

OTHER PUBLICATIONS

Korean Office Action issued on Mar. 30, 2009 in corresponding Korean Patent Application 10-2007-0113931.

* cited by examiner

*Primary Examiner*—Stephen W Smoot

(57) ABSTRACT

A method of manufacturing a wafer level package is disclosed, which may include: coating an insulation layer over one side of a semiconductor chip, on one side of which an electrode pad is formed, such that the electrode pad is open; forming a seed layer by depositing a conductive metal onto one side of the semiconductor chip; forming a rewiring pattern that is electrically connected with the electrode pad, by selective electroplating with the seed layer as an electrode; forming a conductive pillar that is electrically connected with the rewiring pattern, by selective electroplating with the seed layer as an electrode; and removing portions of the seed layer open to the exterior. By forming the rewiring pattern and the metal pillar using one seed layer, the manufacturing process can be simplified, whereby defects during the manufacturing process can be reduced and the reliability of the products can be improved.

5 Claims, 30 Drawing Sheets

METHOD OF MANUFACTURING A WAFER LEVEL PACKAGE THAT USES THE SAME SEED LAYER FOR SELECTIVELY ELECTROPLATING A REWIRING PATTERN AND A CONDUCTIVE PILLAR

CROSS-REFERENCE TO RELATED APPLICATIONS

This application claims the benefit of Korean Patent Application No. 10-2007-0113931 filed with the Korean Intellectual Property Office on Nov. 8, 2007, the disclosure of which is incorporated herein by reference in its entirety.

BACKGROUND

1. Technical Field

The present invention relates to a method of manufacturing a wafer level package.

2. Description of the Related Art

The trends in the electronics industry are to manufacture lighter and smaller products that provide faster speed, greater functionality, higher performance, and higher reliability at lower costs. An important technology that makes this possible is package technology, where the wafer level package (WLP) technology is receiving attention as an area of technology that enables the realizing of products with smaller sizes, lighter weights, and higher performances, etc.

FIG. 1 through FIG. 13 represent a flow diagram illustrating a method of manufacturing a wafer level package according to the related art. Looking at the method of manufacturing a wafer level package according to the related art with reference to FIG. 1 through FIG. 13, first, as illustrated in FIG. 1, over a semiconductor chip 102, on which a passivation layer 108 is formed such that an electrode pad 104 uncovered, a first insulation layer 106 may be stacked such that the electrode pad 104 is uncovered. Next, as illustrated in FIG. 2, a first seed layer 110 may be formed over the electrode pad 104 and the first insulation layer 106, to electrically connect the electrode pad 104 and the first seed layer 110. Next, as illustrated in FIG. 3, a plating resist 112 may be formed, in order to form a rewiring pattern 114 that electrically connects with the electrode pad 104. Next, as illustrated in FIG. 4, electroplating may be performed, using the first seed layer 110 as an electrode, to form the rewiring pattern 114. Next, as illustrated in FIG. 5, the plating resist 112 may be removed, and using the rewiring pattern 114 as a mask, portions of the first seed layer 110 open to the exterior may be etched. Next, as illustrated in FIG. 6, a second insulation layer 116 may be stacked, which leaves a portion of the rewiring pattern 114 uncovered. Next, as illustrated in FIG. 7, a second seed layer 118 may be formed over the uncovered portion of the rewiring pattern 114 and the second insulation layer 116. Next, as illustrated in FIG. 8, a plating resist 119 may be formed, which has an opening corresponding with the open portion of the rewiring pattern 114. Next, as illustrated in FIG. 9, electroplating may be performed, using the second seed layer 118 as an electrode, to form a metal pillar 120. Next, as illustrated in FIGS. 10 and 11, the plating resist 119 and the second seed layer 118 may be removed, and the surface of the semiconductor chip 102 may be molded with epoxy 122. Next, as illustrated in FIG. 12, portions of the molded epoxy 122 may be removed, such that a portion of the metal pillar 120 is uncovered. Next, as illustrated in FIGS. 12 and 13, a solder ball 124 may be attached to the metal pillar 120, and the solder ball 124 may be reflowed.

In the method of manufacturing a wafer level package according to the related art, the seed layer for plating the rewiring pattern and the seed layer for plating the metal pillar may be formed individually, and after the plating processes, etching processes may be required for removing the seed layers. Consequently, the manufacturing process can be complicated, and there is a higher risk of defects occurring during manufacture.

Also, the twofold stacking of insulation layers over the semiconductor chip, as well as the attaching of a solder ball, may cause increases in manufacturing costs.

SUMMARY

An aspect of the invention provides a method of manufacturing a wafer level package, in which a seed layer for forming a rewiring pattern may be used to form a metal pillar, to increase the efficiency of the manufacturing process and the reliability of the manufactured product.

Another aspect of the invention provides a method of manufacturing a wafer level package that includes: coating an insulation layer over one side of a semiconductor chip, on one side of which an electrode pad is formed, such that the electrode pad is open; forming a seed layer by depositing a conductive metal onto one side of the semiconductor chip; forming a rewiring pattern that is electrically connected with the electrode pad, by selective electroplating with the seed layer as an electrode; forming a conductive pillar that is electrically connected with the rewiring pattern, by selective electroplating with the seed layer as an electrode; and removing portions of the seed layer open to the exterior.

The coating of the insulation layer can include spin coating an insulation material that contains a polymer.

The operation of forming the rewiring pattern may include: stacking a first photosensitive film layer on one side of the semiconductor chip; removing a portion of the first photosensitive film layer by selectively exposing and developing the first photosensitive film layer, such that an area corresponding to a position where the electrode pad and the rewiring pattern are formed is open; performing electroplating with the seed layer as an electrode; and removing portions of the first photosensitive film layer remaining on the semiconductor chip.

The operation of forming the conductive pillar may include: stacking a second photosensitive film on one side of the semiconductor chip; forming an opening by selectively exposing and developing the second photosensitive film layer to remove a portion of the second photosensitive film layer, such that a portion of an area corresponding to a position where the conductive pillar is formed is open; forming a first metal pillar by performing electroplating with the seed layer as an electrode such that a portion of the opening is filled; forming a second metal pillar by performing electroplating with the seed layer as an electrode, such that a remaining portion of the opening is filled; and removing the second photosensitive film layer remaining on the semiconductor chip.

In certain embodiments, the method may further include, after the removing of the seed layer: reflowing the second metal pillar; molding the semiconductor chip with epoxy; and opening a portion of the reflowed second metal pillar by performing plasma etching on the molded epoxy. In such cases, operations of forming a solder ball on the open portion of the second metal pillar and of reflowing the solder ball may additionally be included.

The molding of the semiconductor chip with epoxy can be performed by spin coating the epoxy.

The first metal pillar can be made from copper (Cu), and the second metal pillar can be made from tin (Sn).

Additional aspects and advantages of the present invention will be set forth in part in the description which follows, and in part will be obvious from the description, or may be learned by practice of the invention.

DETAILED DESCRIPTION

Figure 1:
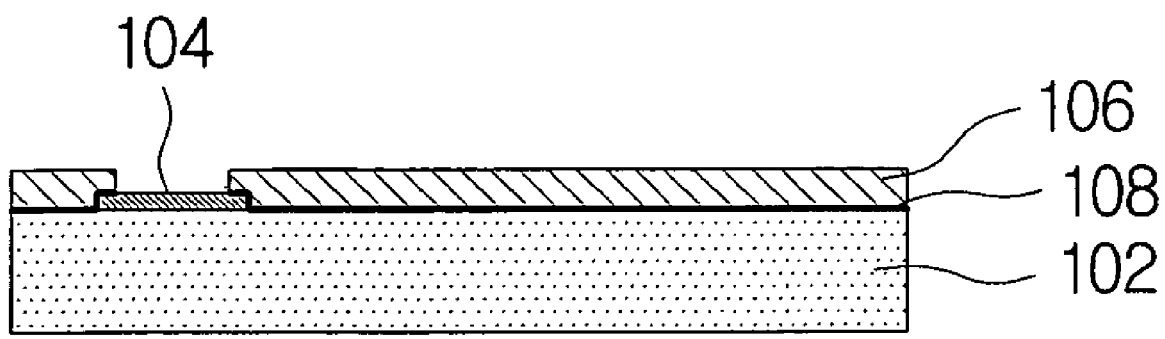
FIG. 1, FIG. 2, FIG. 3, FIG. 4, FIG. 5, FIG. 6, FIG. 7, FIG. 8, FIG. 9, FIG. 10, FIG. 11, FIG. 12, and FIG. 13 are cross-sectional views representing a flow diagram for a method of manufacturing a wafer level package according to the related art.
Figure 2:
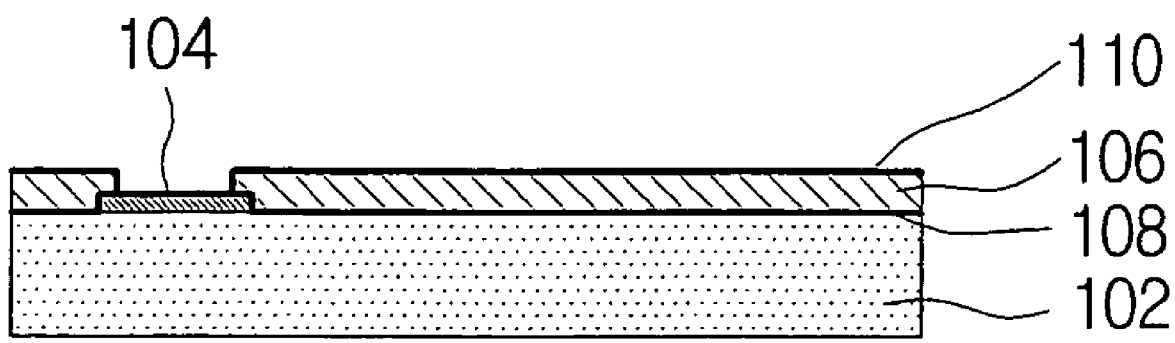
Figure 3:
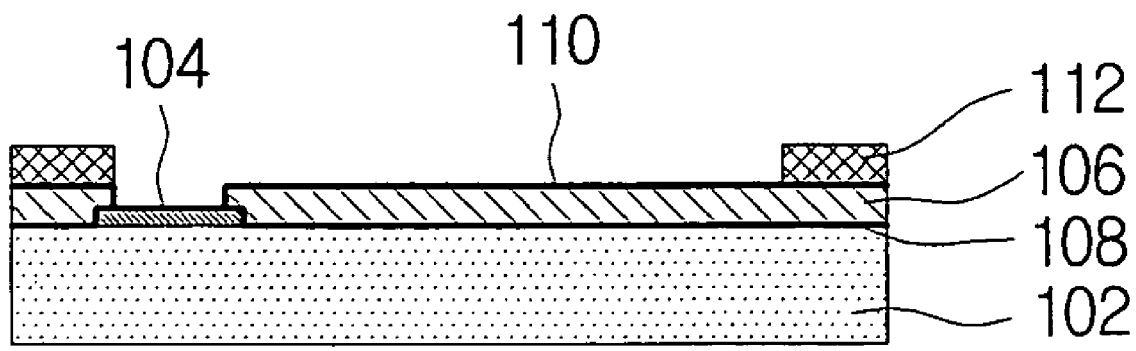
Figure 4:
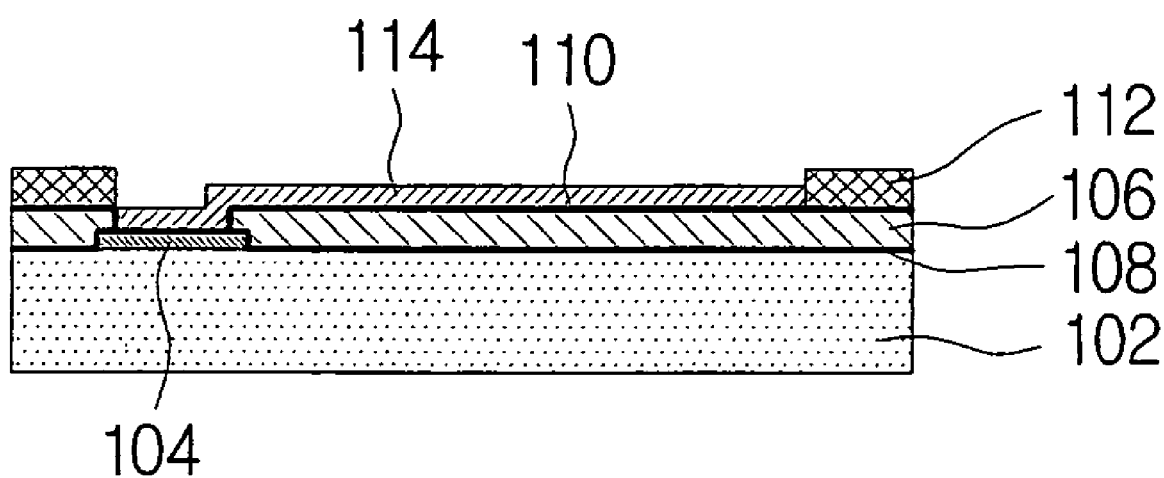
Figure 5:
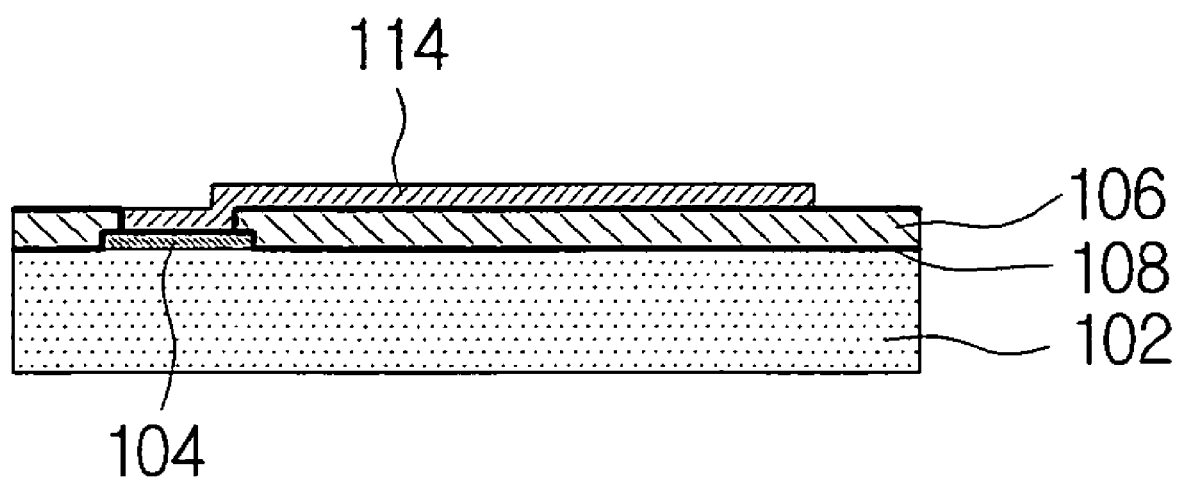
Figure 6:
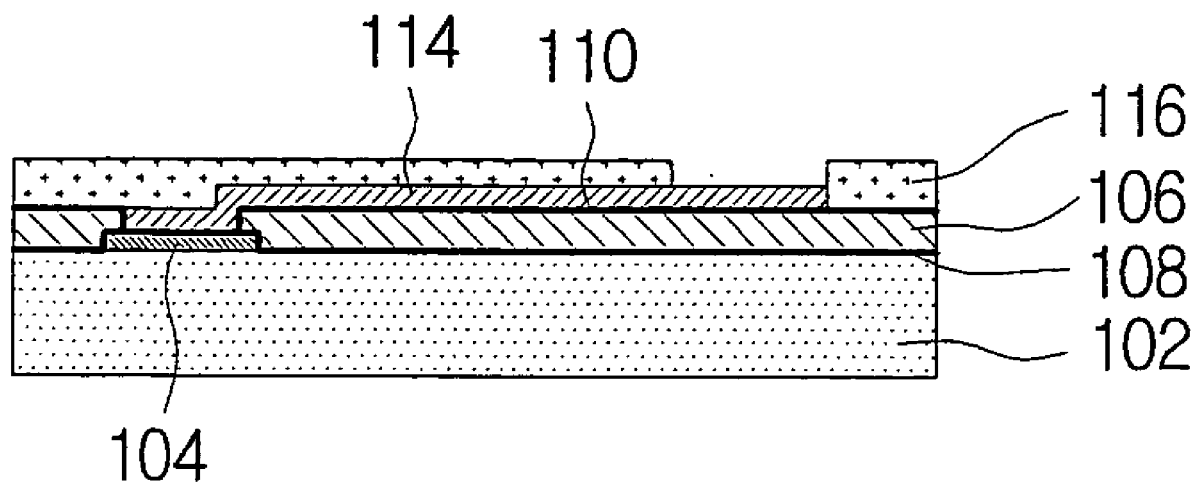
Figure 7:
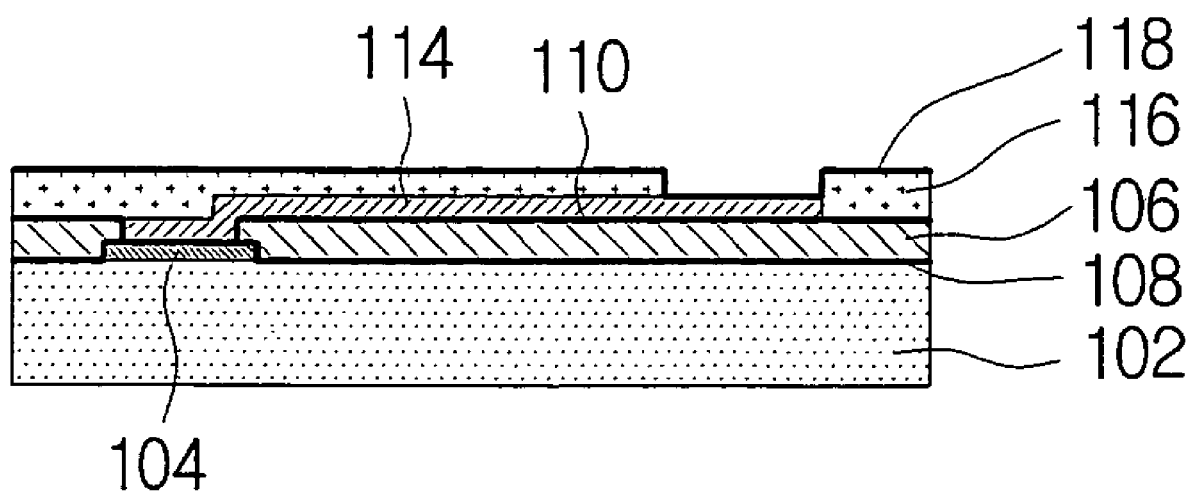
Figure 8:
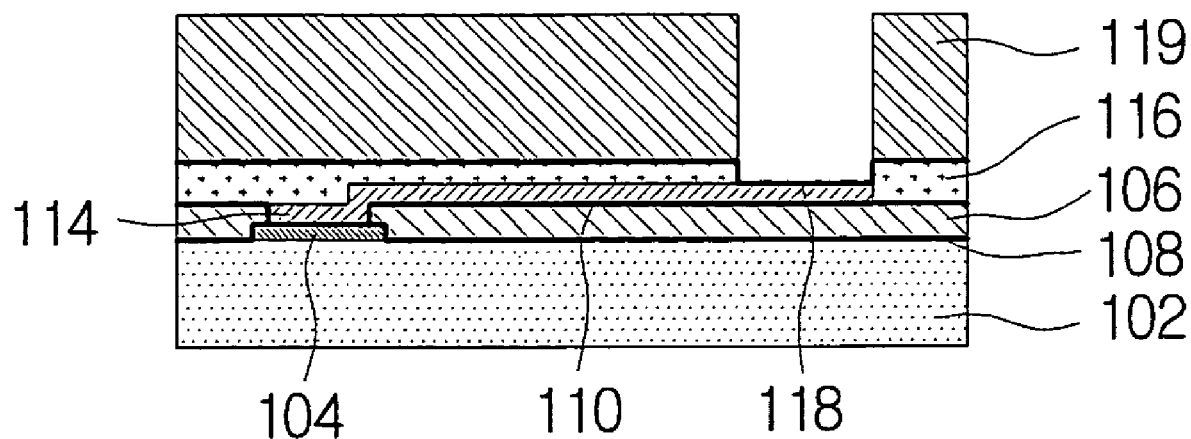
Figure 9:
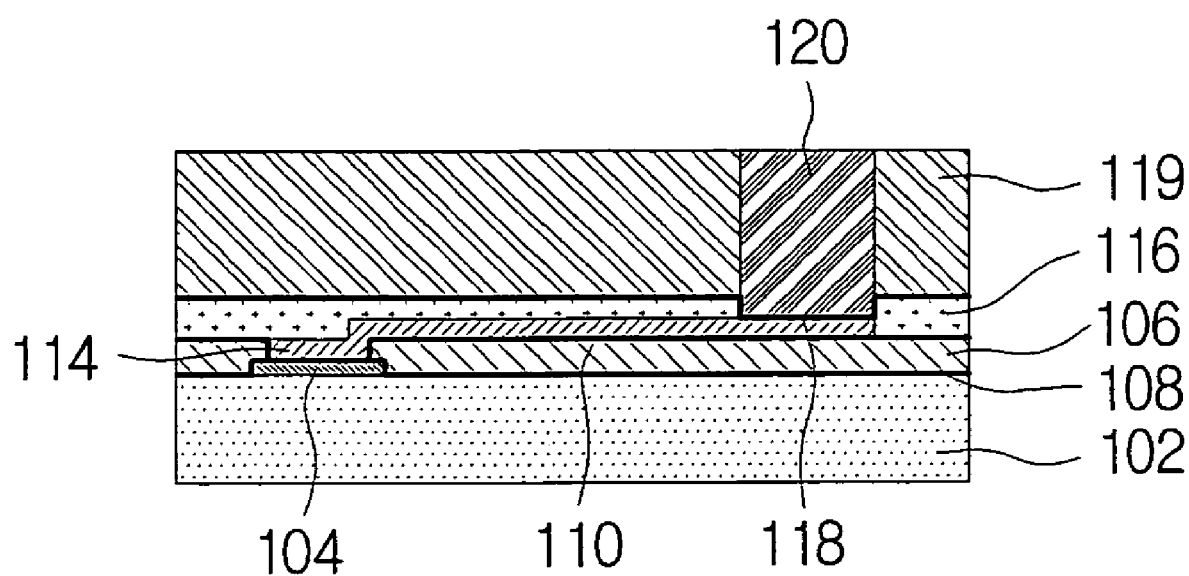
Figure 10:
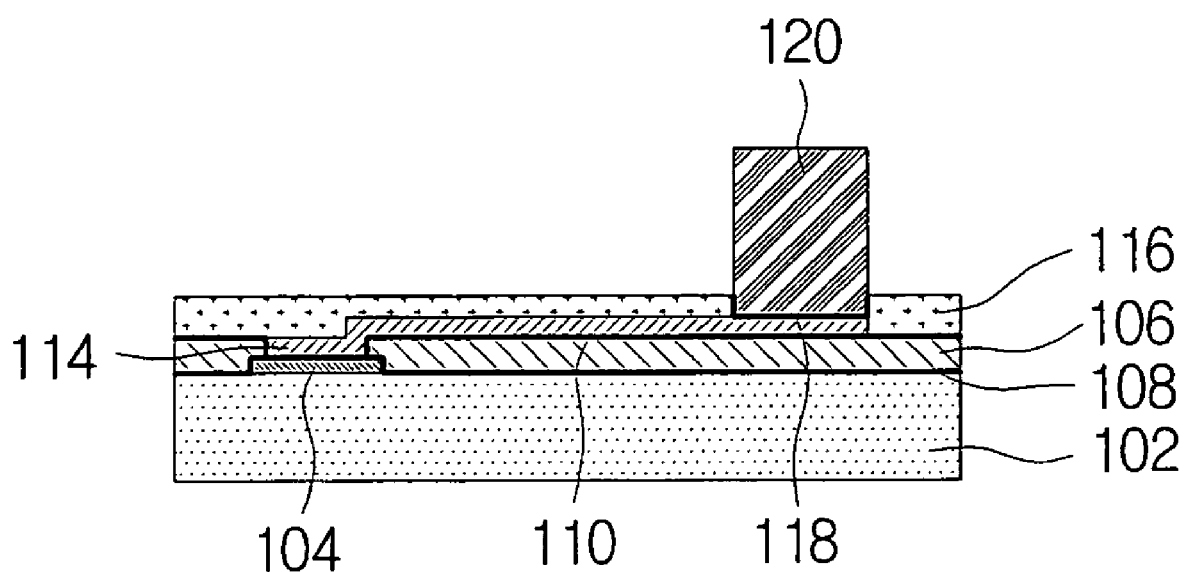
Figure 11:
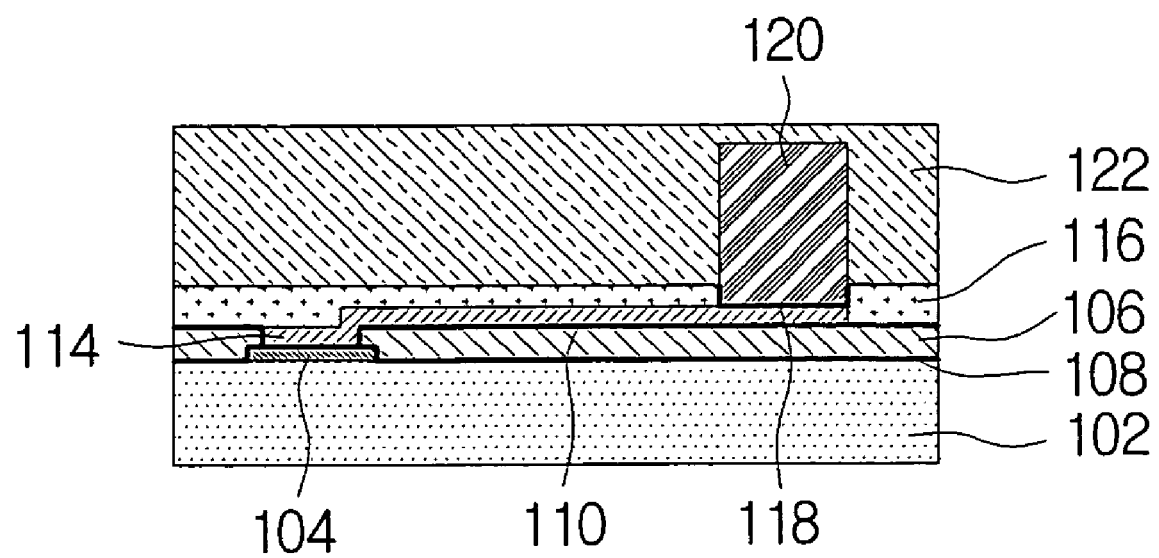
Figure 12:
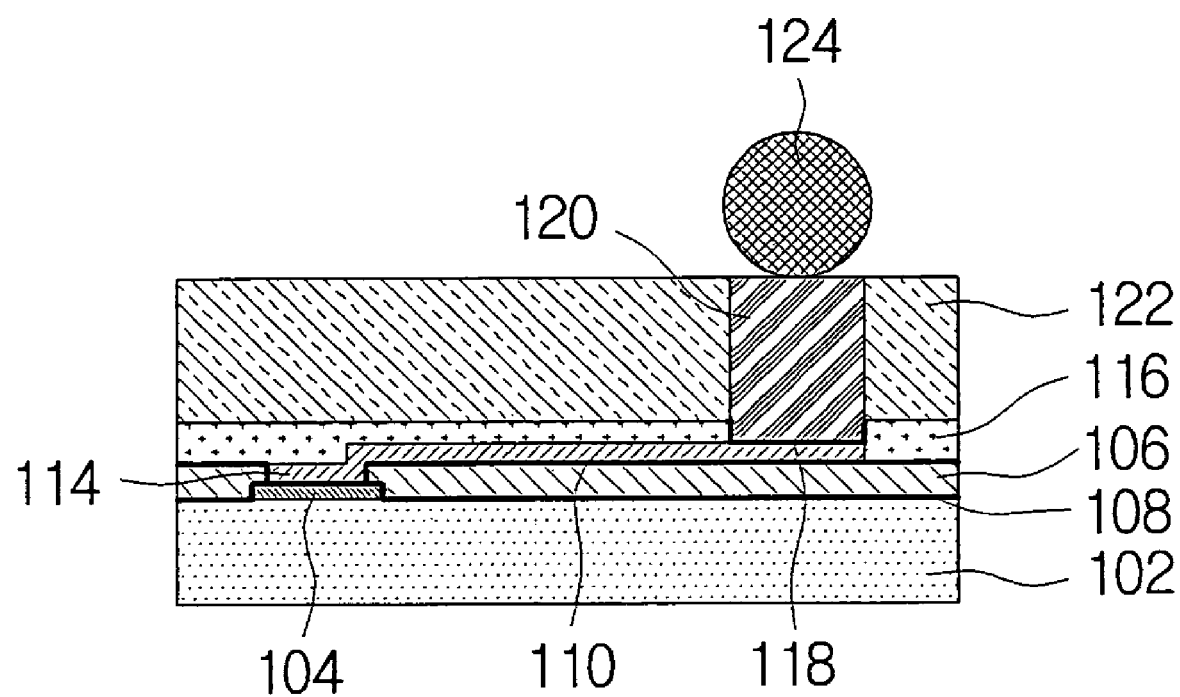
Figure 13:
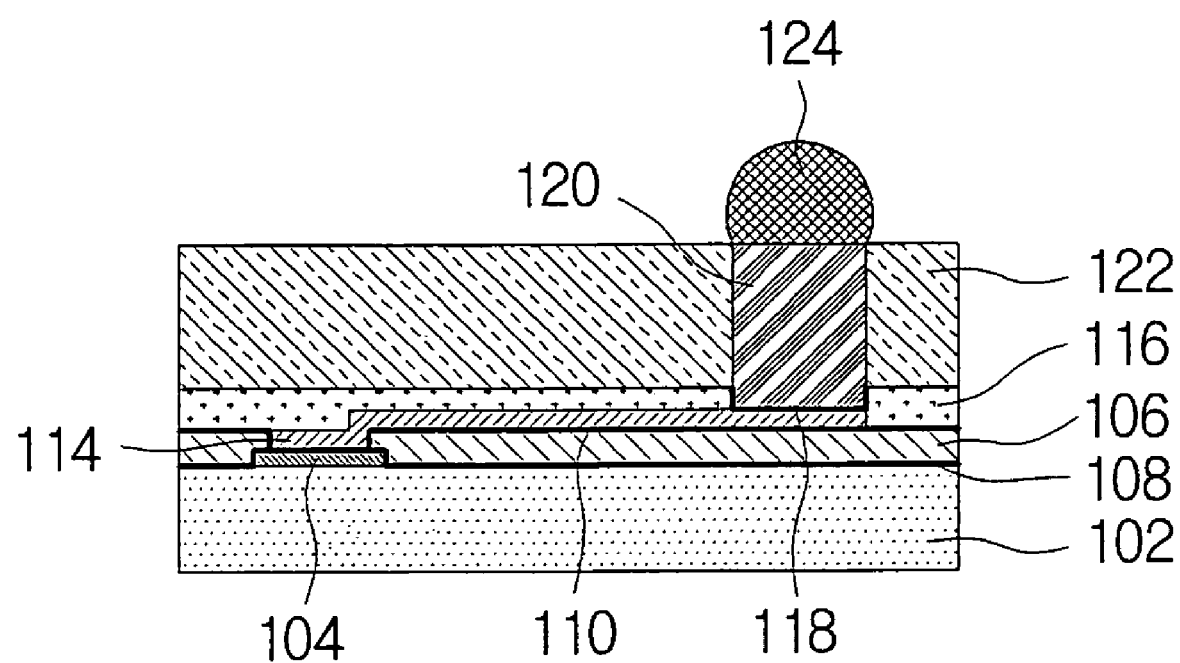

As the invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various elements, such elements must not be limited to the above terms. The above terms are used only to distinguish one element from another.

The terms used in the present application are merely used to describe particular embodiments, and are not intended to limit the present invention. An expression used in the singular encompasses the expression of the plural, unless it has a clearly different meaning in the context. In the present application, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

The method of manufacturing a wafer level package according to certain embodiments of the invention will be described below in more detail with reference to the accompanying drawings. Those components that are the same or are in correspondence are rendered the same reference numeral regardless of the figure number, and redundant explanations are omitted.

Figure 14:
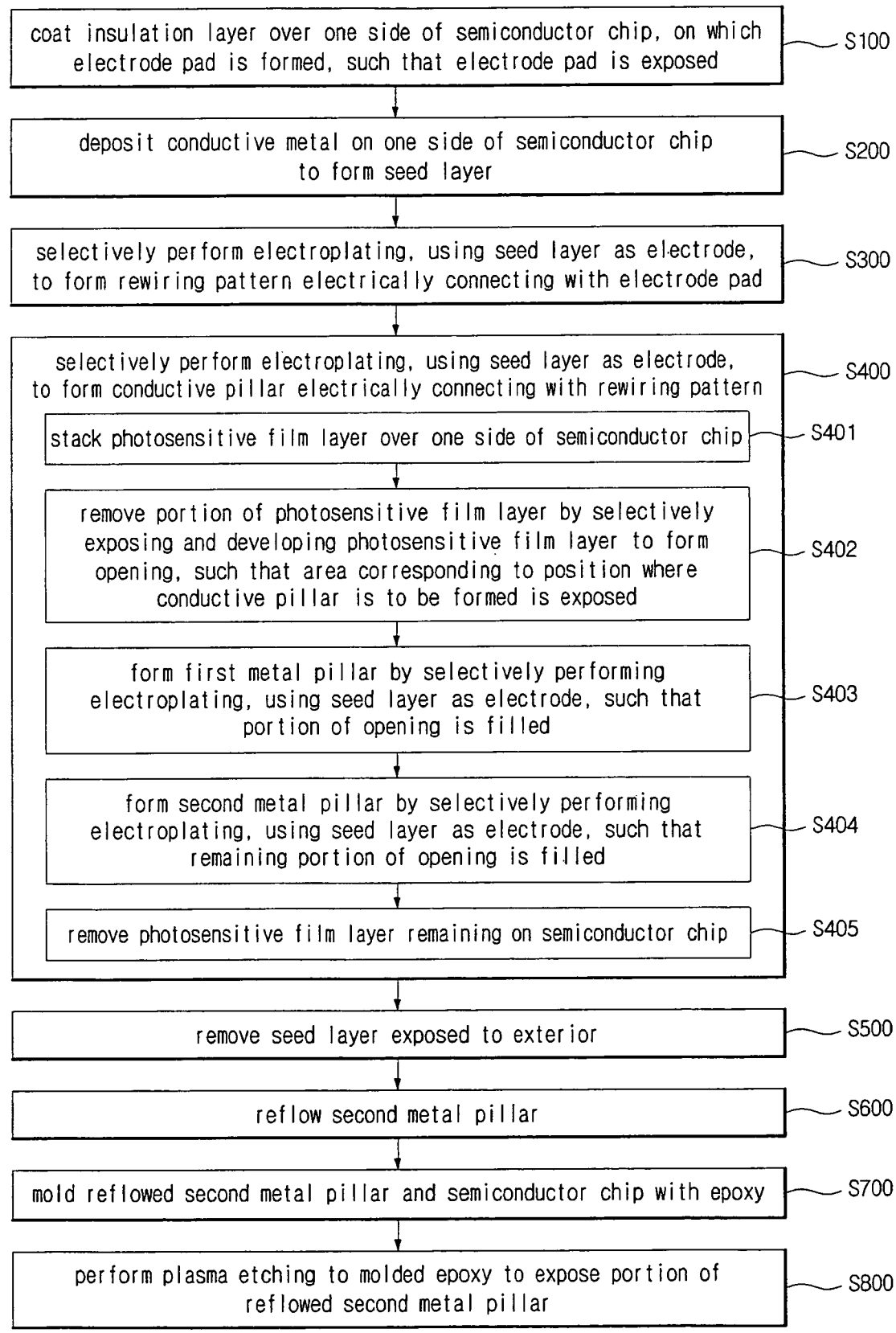
FIG. 14 is a flowchart for a method of manufacturing a wafer level package according to an embodiment of the invention.

FIG. 14 is a flowchart for a method of manufacturing a wafer level package according to an embodiment of the invention, and FIG. 15 through FIG. 25 are cross-sectional views representing a flow diagram for a method of manufacturing a wafer level package according to an embodiment of the invention. In FIGS. 15 to 25, there are illustrated a semiconductor chip 12, an electrode pad 14, a passivation layer 16, an insulation layer 18, a seed layer 20, a first photosensitive film layer 22, a rewiring pattern 24, a second photosensitive film layer 26, an opening 27, a first metal pillar 28, a conductive pillar 29, a second metal pillar 30, and epoxy 32.

This embodiment presents a method of manufacturing a wafer level package, which may include coating an insulation layer 18 over one side of a semiconductor chip 12, on one side of which an electrode pad 14 is formed, such that the electrode pad 14 is open; forming a seed layer 20 by depositing a conductive metal onto one side of the semiconductor chip 12; forming a rewiring pattern 24 that is electrically connected with the electrode pad 14, by performing selective electroplating with the seed layer 20 as an electrode; forming a conductive pillar 29 that is electrically connected with the rewiring pattern 24, by performing selective electroplating with the seed layer 20 as an electrode; and removing portions of the seed layer 20. As the rewiring pattern 24 and metal pillar may be formed using a single seed layer 20, the manufacturing process can be simplified, by which defects may be reduced and the reliability of the product may be improved.

Figure 15:
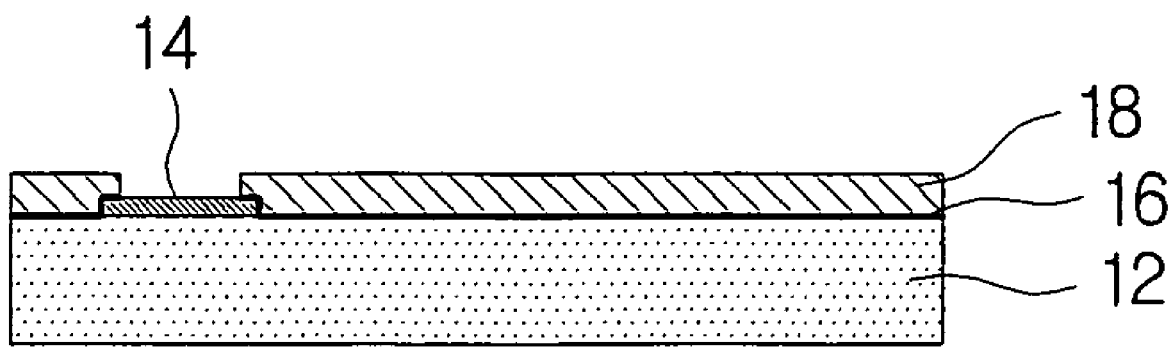
FIG. 15, FIG. 16, FIG. 17, FIG. 18, FIG. 19, FIG. 20, FIG. 21, FIG. 22, FIG. 23, FIG. 24, and FIG. 25 are cross-sectional views representing a flow diagram for a method of manufacturing a wafer level package according to an embodiment of the invention.

Looking at the method of manufacturing a wafer level package according to the present embodiment, first, as illustrated in FIG. 15, an insulation layer 18 may be coated over one side of a semiconductor chip 12, on the one side of which an electrode pad 14 may be formed, such that the electrode pad 14 is open (S100). The one side of the semiconductor chip 12 can include several electrode pads 14, formed by a typical wafer fabrication process, as well as a passivation layer 16, which has the electrode pads 14 open, and which protects the integrated circuit formed within the semiconductor chip 12.

The insulation layer 18 may be coated over one side of the semiconductor chip 12 such that the electrode pad 14, which is to be electrically connected with a rewiring pattern 24, is open. The insulation layer 18 may serve as electrical insulation and may also serve to alleviate thermal stresses, and the insulation layer 18 can be made from an insulating material containing polymers. To open the electrode pad 14, an insulating material containing photosensitive polymers may be coated on, and then the insulating material can be selectively exposed and developed, leaving the electrode pad 14 open.

The coating of an insulating material containing photosensitive polymers over one side of the semiconductor chip 12 can be achieved using any one of a spin coating method, in which the semiconductor chip 12 is rotated at high speeds while liquid polymers are applied for coating, a spray coating method, in which liquid polymers are coated onto the semiconductor chip 12 by way of a spray, and a screen printing method, in which liquid polymers are printed onto one side of the semiconductor chip 12 using a screen. These methods can provide a low thickness for the insulation layer coated on the semiconductor chip 12. Of course, any of various other methods known to those skilled in the art may also be used.

Figure 16:
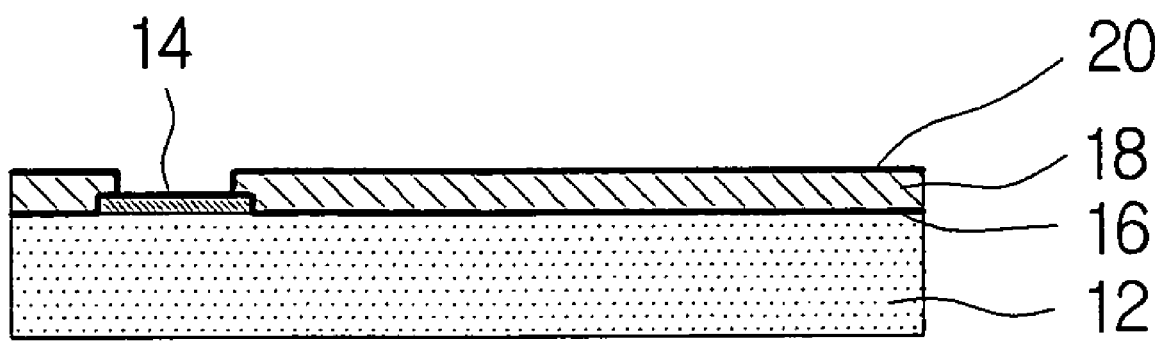

Next, as illustrated in FIG. 16, a conductive metal may be deposited onto one side of the semiconductor chip 12 to form a seed layer 20 (S200). The seed layer 20 formed in this process may be used as an electrode for forming a rewiring pattern 24 and a conductive pillar 29. Since the rewiring pattern 24 and the conductive pillar 29 may be formed using this single seed layer 20, the manufacturing process can be simplified, so that defects may be reduced and the reliability of the products may be improved. The method for depositing a conductive metal can include methods such as evaporation methods, sputtering methods, and electroless plating methods, etc.

The seed layer 20 may be formed over the electrode pad 14 of the semiconductor chip 12 opened by the insulation layer 18, as well as over the insulation layer 18 itself.

Figure 17:
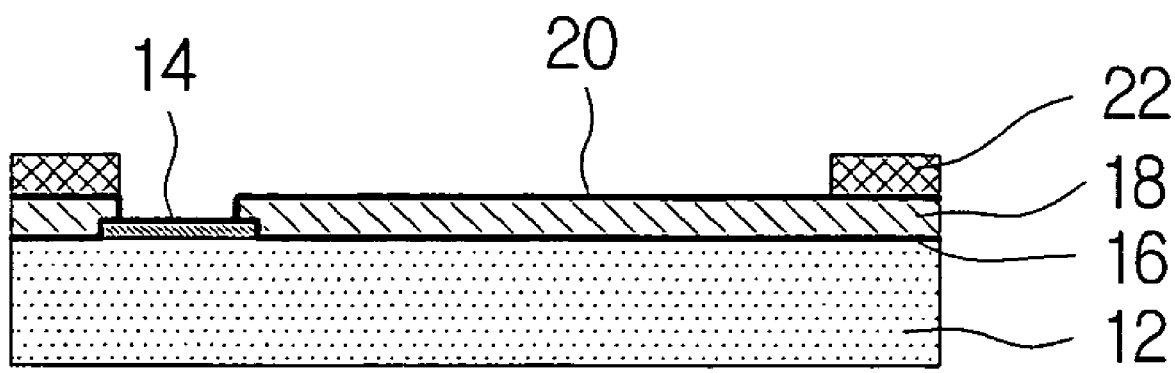
Figure 18:
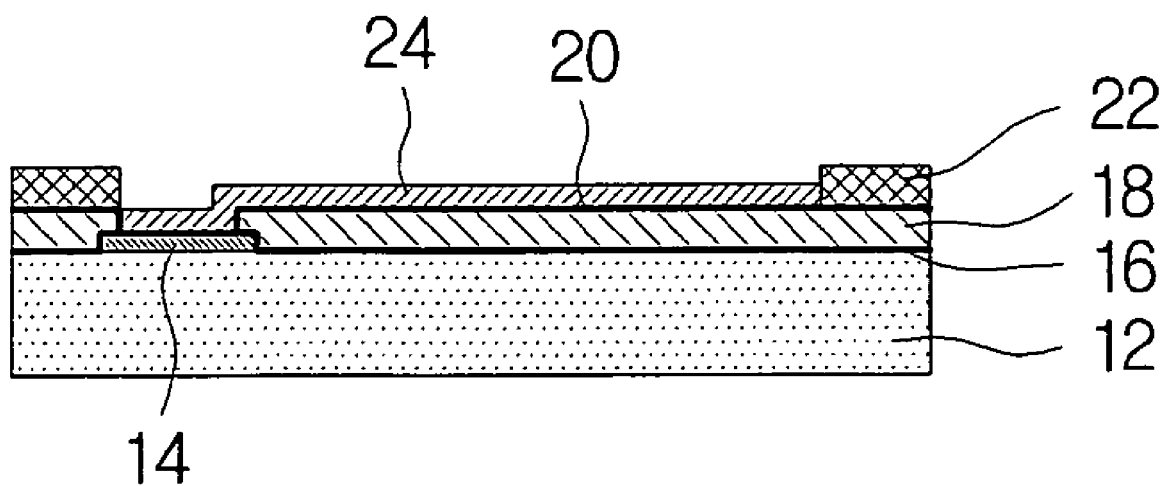
Figure 19:
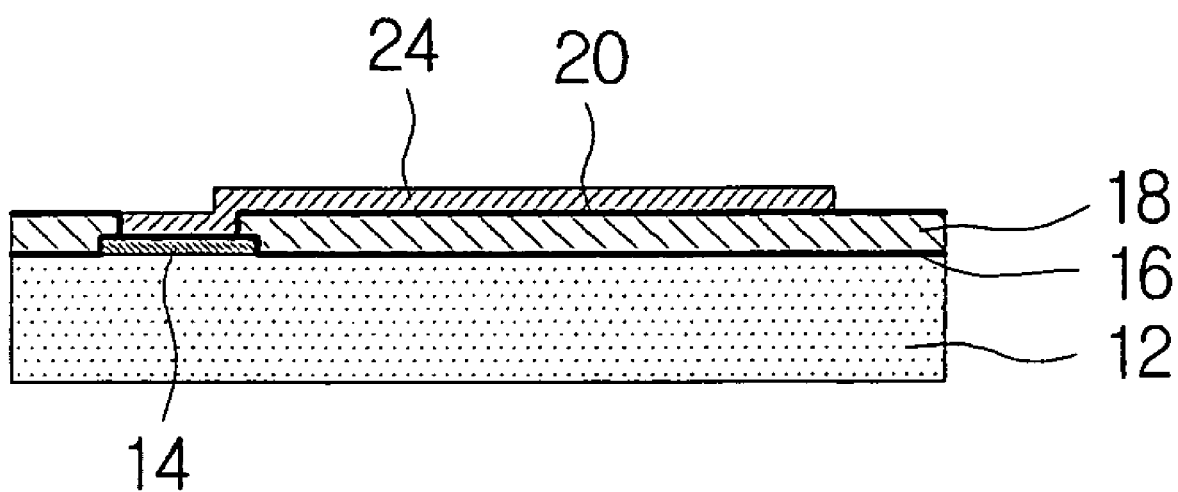

Next, as illustrated in FIGS. 17 to 19, electroplating may be performed selectively, using the seed layer 20 as an electrode, to form a rewiring pattern 24 that electrically connects with the electrode pad 14 (S300).

The method of performing electroplating to selectively form the rewiring pattern 24 may include, as illustrated in FIG. 17, stacking a first photosensitive film layer 22 over one side of the semiconductor chip 12, and selectively exposing and developing the first photosensitive film layer 22 to remove portions of the first photosensitive film layer 22, such that the area corresponding to where the electrode pad 14 and the rewiring pattern 24 are formed is opened. Then, as illustrated in FIG. 18, electroplating may be performed using the seed layer 20 as an electrode, to form the rewiring pattern 24 that connects with the electrode pad 14. Afterwards, as illustrated in FIG. 19, the first photosensitive film layer 22 remaining on the semiconductor chip 12 may be removed.

Figure 20:
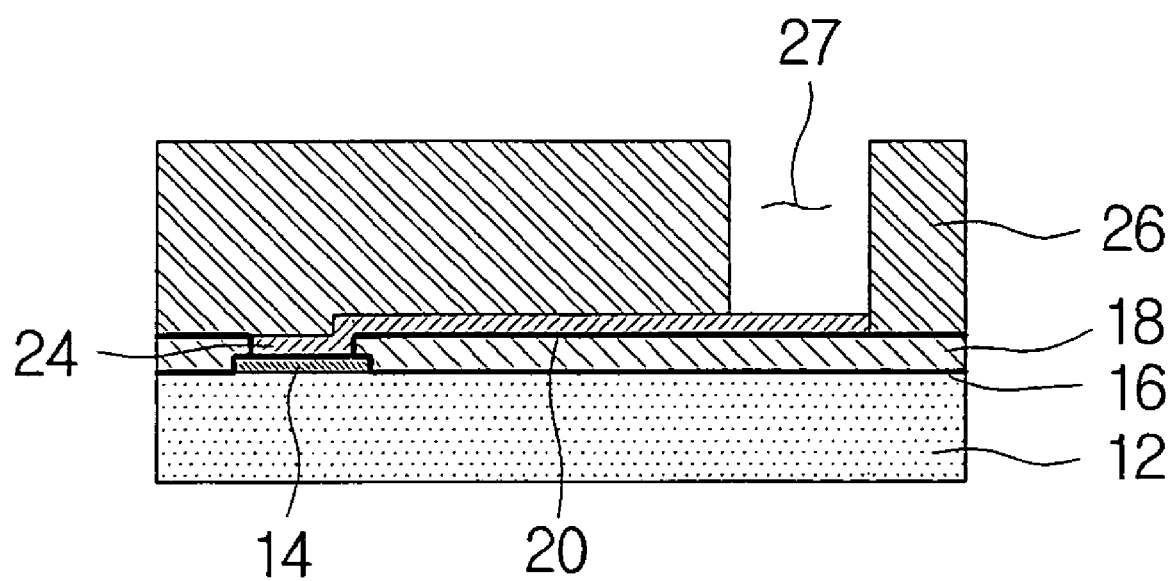
Figure 21:
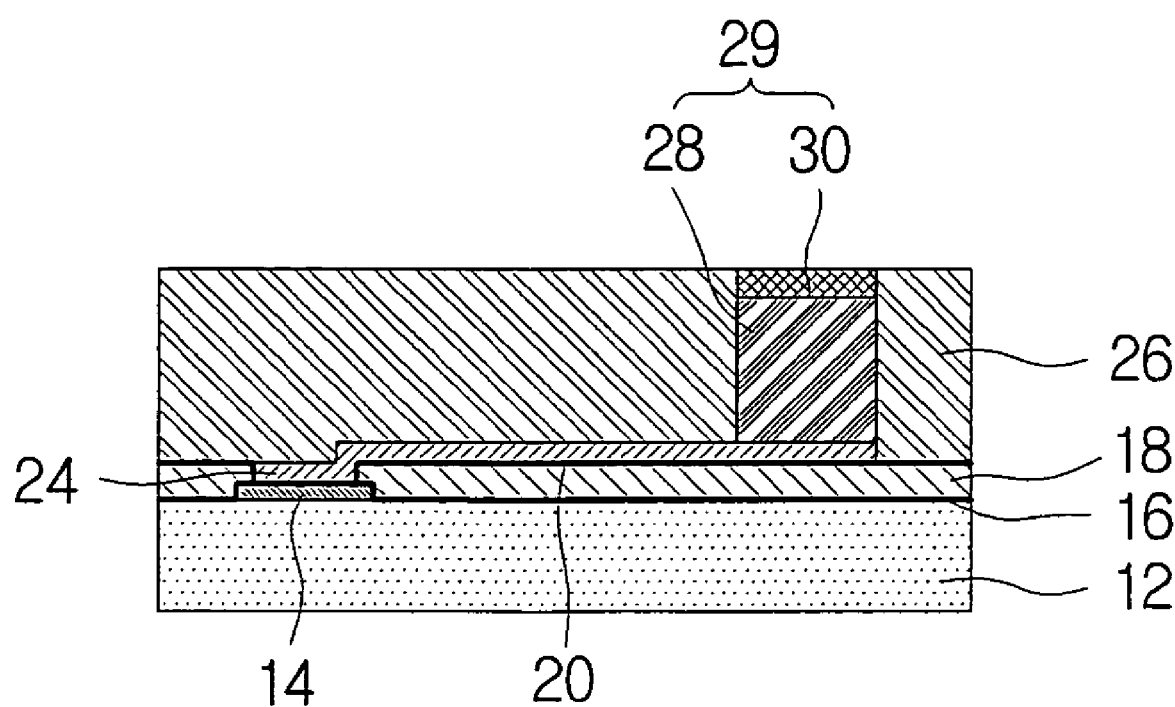

Next, as illustrated in FIGS. 20 and 21, electroplating may be performed selectively, using the seed layer 20 as an electrode, to form a conductive pillar 29 that electrically connects with the rewiring pattern 24 (S400).

Unlike the conventional method of manufacturing a wafer level package, the seed layer 20 for forming the rewiring pattern 24 may not be removed, and instead may be used as an electrode in performing electroplating to form the conductive pillar 29 over a portion of the rewiring pattern 24, whereby the manufacturing process can be shortened. Furthermore, whereas in the related art, an insulation layer is formed again over the rewiring pattern 24 and a bump pad is formed over a portion of the rewiring pattern 24, certain embodiments of this invention can have the conductive pillar 29 formed directly over the rewiring pattern 24, so that the process of stacking an insulation layer over the rewiring pattern 24 may be omitted, to allow a shortened manufacturing process and lowered manufacturing costs.

The method of performing electroplating to selectively form the conductive pillar 29 may include, as illustrated in FIG. 20, stacking a second photosensitive film layer 26 over one side of the semiconductor chip 12 (S401), and forming an opening 27 by selectively exposing and developing the second photosensitive film layer 26 to remove portions of the second photosensitive film layer 26, such that a portion of the rewiring pattern 24 corresponding to where the conductive pillar 29 is to be formed is opened (S402). Here, in order that the conductive pillar 29 may be formed to a great height, the second photosensitive film layer 26 can be formed to a large thickness. By thus increasing the height of the conductive pillar 29, the overall thickness of the wafer level package can be increased. Next, as illustrated in FIG. 21, electroplating may be performed using the seed layer 20 as an electrode such that a portion of the opening 27 is filled, to form a first metal pillar 28 (S403), and then electroplating may be performed using the seed layer 20 as an electrode such that the remaining portion of the opening 27 is filled, to form a second metal pillar 30 (S404). The conductive pillar 29 in this embodiment may consist of a first metal pillar 28, and a second metal pillar 30 formed on one end of the first metal pillar 28, where the second metal pillar 30 can be made by a subsequent reflow process into a hemispherical bump. By thus reflowing a portion of the conductive pillar 29, the process for attaching a solder ball 34 can be omitted, so that the manufacturing process can be simplified, while manufacturing costs can be lowered. Of course, it is also possible to form the conductive pillar 29 by depositing one type of metal in the opening 27 by electroplating and then attaching a solder ball 34 to the end of the conductive pillar 29.

The first metal pillar 28 can be formed by electroplating copper (Cu), and the second metal pillar 30 can be formed by electroplating tin (Sn). This second metal pillar 30 made of tin (Sn) can be made into a bump by a reflow process.

Figure 22:
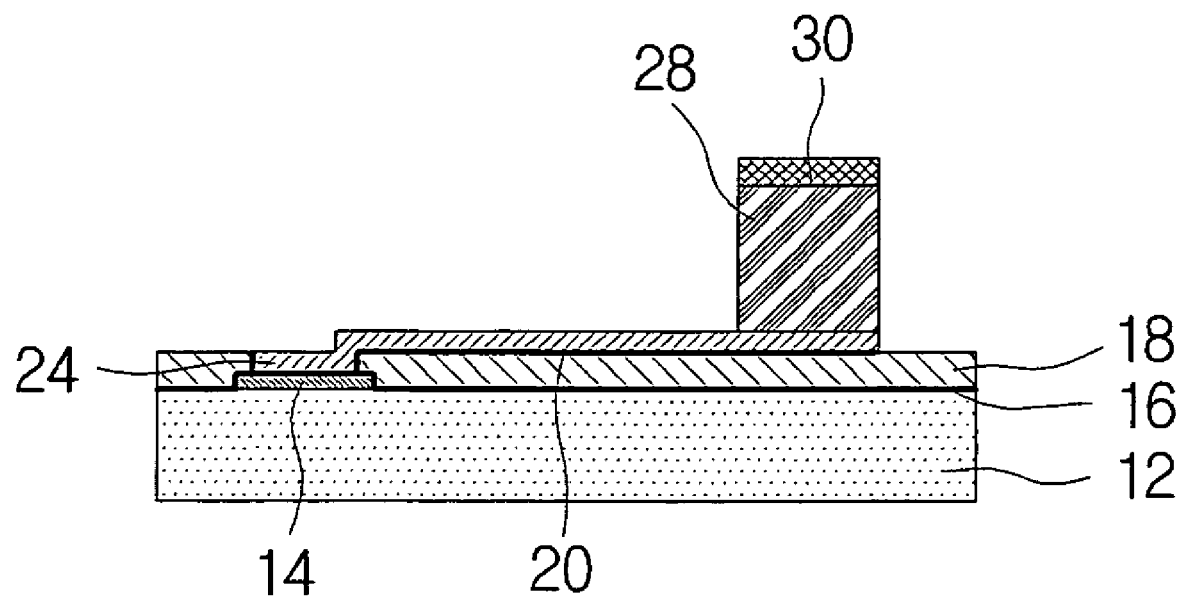

Next, as illustrated in FIG. 22, the second photosensitive film layer 26 remaining on the semiconductor chip 12 may be removed (S405), and the seed layer 20 exposed to the exterior may be removed (S500). When the conductive pillar 29 is formed, including the first metal pillar 28 and the second metal pillar 30, the second photosensitive film layer 26 remaining on the semiconductor chip 12 may be removed, and the seed layer 20 exposed to the exterior may be removed. The seed layer 20 can be removed using the rewiring pattern 24 as a mask. If the seed layer 20 and the rewiring pattern 24 are made from conductive materials that react to different etchants, the seed layer 20 exposed to the exterior may be removed by applying an etchant that reacts only with the seed layer 20.

Figure 23:
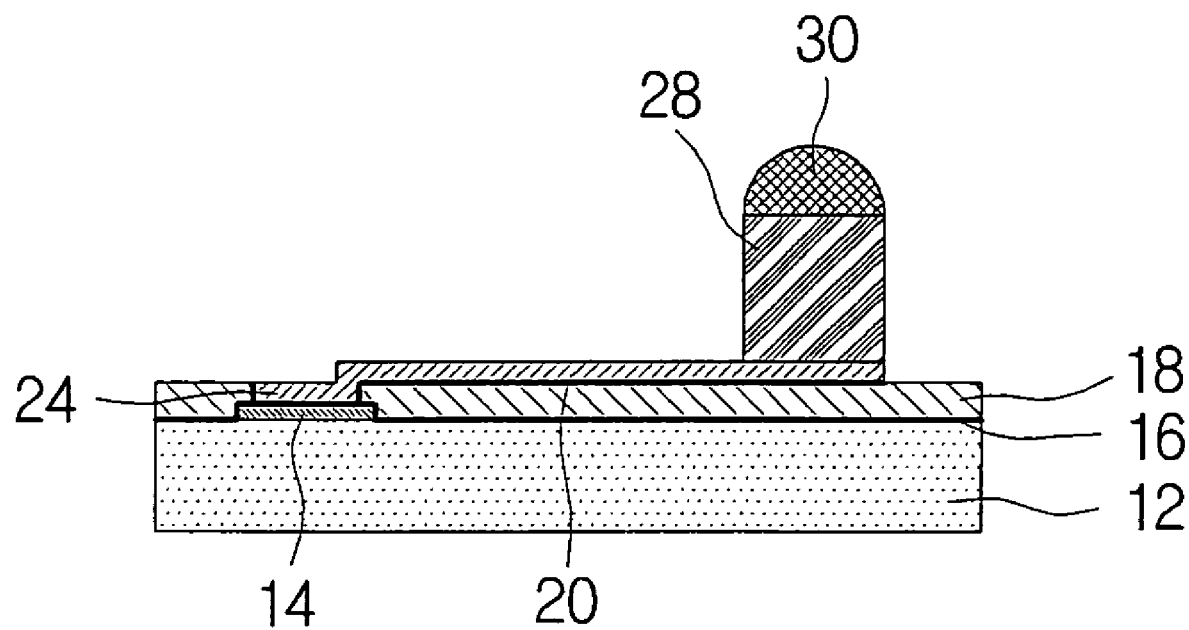

Next, as illustrated in FIG. 23, the second metal pillar 30 may be reflowed (S600). Reflowing the second metal pillar 30 may result in a hemispherical bump formed on one end of the first metal pillar 28.

Figure 24:
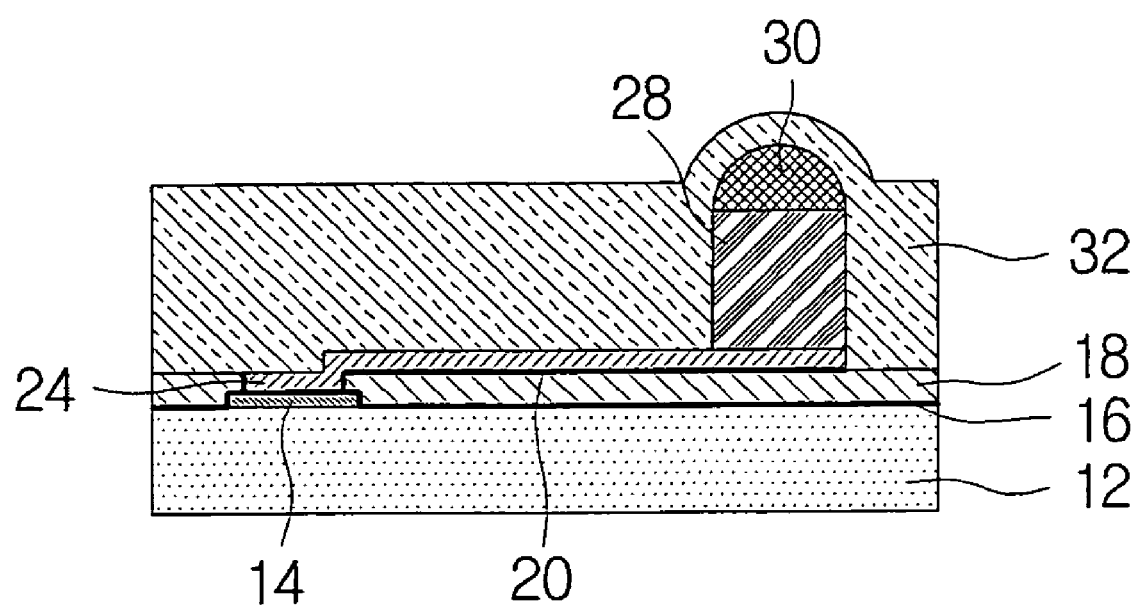

Next, as illustrated in FIG. 24, the semiconductor chip 12 may be molded with epoxy 32 (S700). Epoxy 32 may be coated and molded on one side of the semiconductor chip 12, as a part of packaging the semiconductor chip 12. To mold the semiconductor chip 12 with epoxy 32, the epoxy 32 can be coated on one side of the semiconductor chip 12 by way of a spin coating method. Alternatively, a spray coating method may be used, of applying liquid epoxy 32 onto the one side of the semiconductor chip by way of a spray, or a screen printing method may be used, of printing liquid epoxy 32 onto the one side of the semiconductor chip using a screen. These methods can provide a low thickness for the molded epoxy 32. Of course, any of various other methods known to those skilled in the art may also be used.

Figure 25:
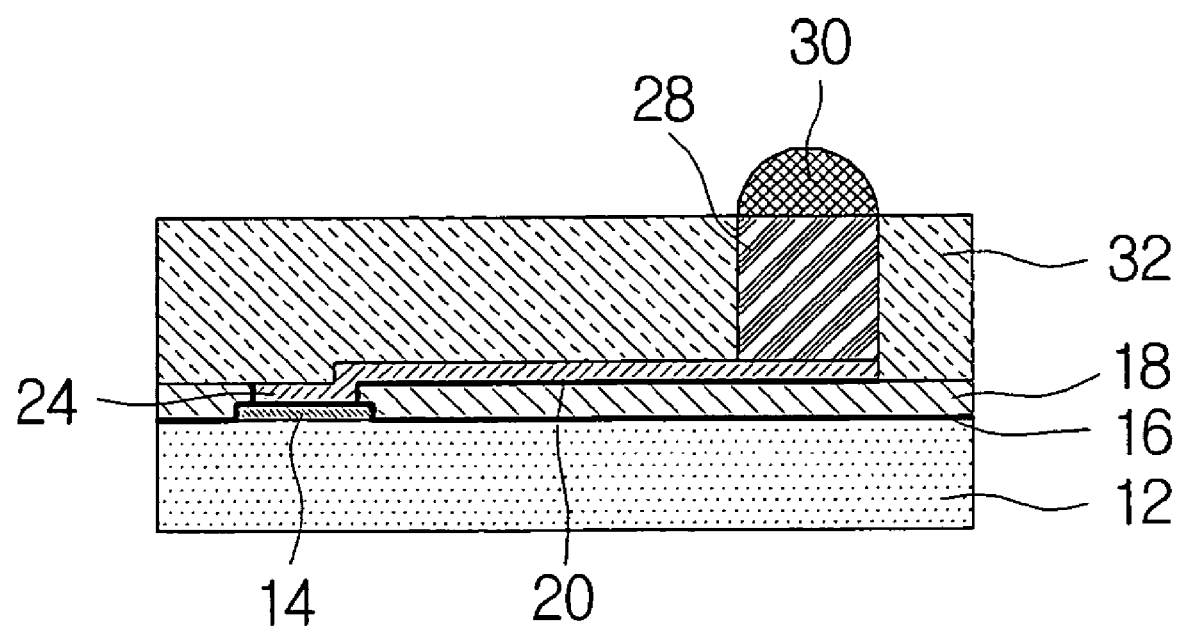

Next, as illustrated in FIG. 25, plasma etching may be performed on the molded epoxy 32, to open a portion of the reflowed second metal pillar 30 (S800). The reflowed second metal pillar 30 may serve as a bump for electrically connecting to an external apparatus, and a portion of the reflowed second metal pillar 30 may be opened by irradiating plasma onto the molded epoxy 32.

In this embodiment, the second metal pillar 30 may be reflowed for use as an external connection terminal, in cases where the pitch between the several electrode pads 14 formed on the one side of the semiconductor chip 12 is small, and where a low bump height is required.

FIG. 26 through FIG. 30 are cross-sectional views representing a portion of a flow diagram for a method of manufacturing a wafer level package according to another embodiment of the invention. In FIGS. 26 to 30, there are illustrated a semiconductor chip 12, an electrode pad 14, a passivation layer 16, an insulation layer 18, a seed layer 20, a rewiring pattern 24, a first metal pillar 28, a conductive pillar 29, a second metal pillar 30, and epoxy 32.

In this embodiment, a solder ball 34 may additionally be attached to a reflowed second metal pillar 30, to increase the height of the bump, in cases where the pitch between the several electrode pads 14 formed on the one side of the semiconductor chip 12 is large, and where a high bump height is required.

The description of this embodiment will focus more on components that are different from those of the previously described embodiment, and the descriptions for substantially the same components as those of the previously described embodiment will not be presented in great detail.

Figure 26:
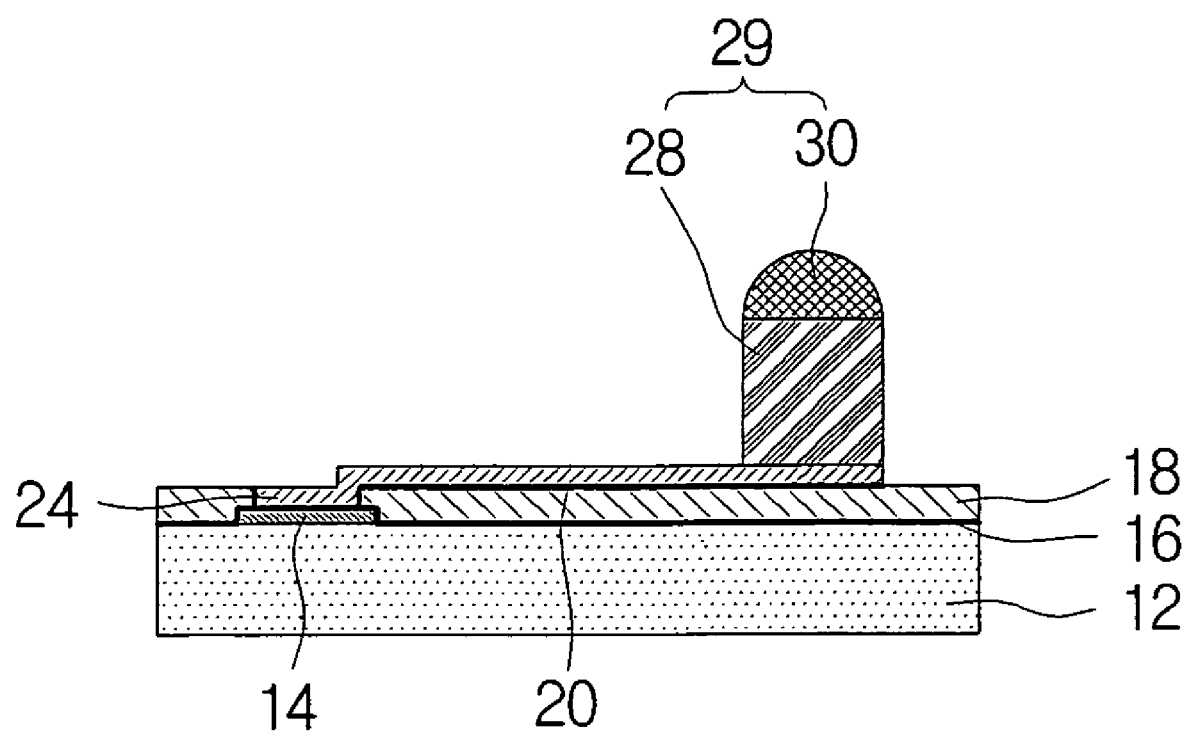
FIG. 26, FIG. 27, FIG. 28, FIG. 29, and FIG. 30 are cross-sectional views representing a portion of a flow diagram for a method of manufacturing a wafer level package according to another embodiment of the invention.

First, looking at a process for forming the conductive pillar 29 that electrically connects with the electrode pad 14 of the semiconductor chip 12, an insulation layer 18 may be coated on one side of a semiconductor chip 12, on one side of which an electrode pad 14 is formed, such that the electrode pad 14 is open, as illustrated in FIG. 26. Next, a conductive metal may be deposited on one side of the semiconductor chip 12 to form the seed layer 20. Next, electroplating may be performed selectively, using the seed layer 20 as an electrode, to form a rewiring pattern 24 electrically connected with the electrode pad 14. Next, electroplating may be performed selectively, using the seed layer 20 as an electrode, to form a conductive pillar 29 electrically connected with the rewiring pattern 24. Next, the seed layer 20 open to the exterior may be removed. Here, the conductive pillar 29 can be composed of a first metal pillar 28 and a second metal pillar 30, as described above, where the second metal pillar 30 can be reflowed to form a hemispherical bump.

These operations are substantially the same as those of the previously described embodiment, and thus will not be described again in further detail. The following will elaborate on those processes of this embodiment that are different from those of the previously described embodiment.

Figure 27:
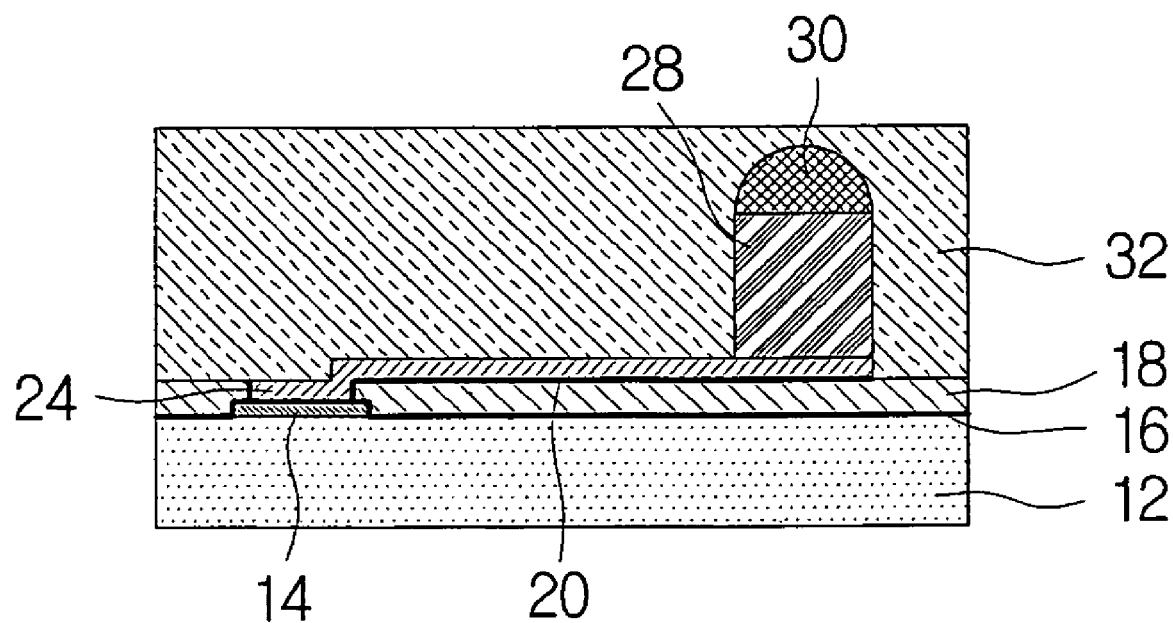

As illustrated in FIG. 27, the semiconductor chip 12 may be molded with epoxy 32. For this embodiment, an example is presented in which the pitch of electrode pads 14 is large, and a high bump height is required, so that a large molding thickness is used for the epoxy 32.

Figure 28:
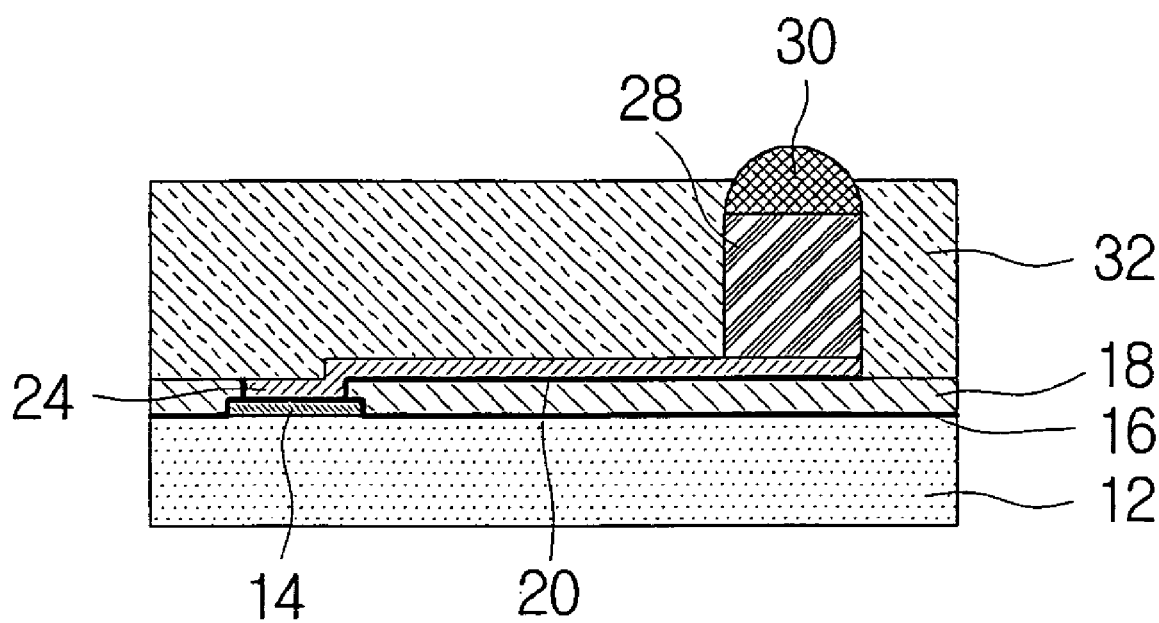

Next, as illustrated in FIG. 28, plasma etching may be performed to the molded epoxy 32, to open a portion of the reflowed second metal pillar 30.

Figure 29:
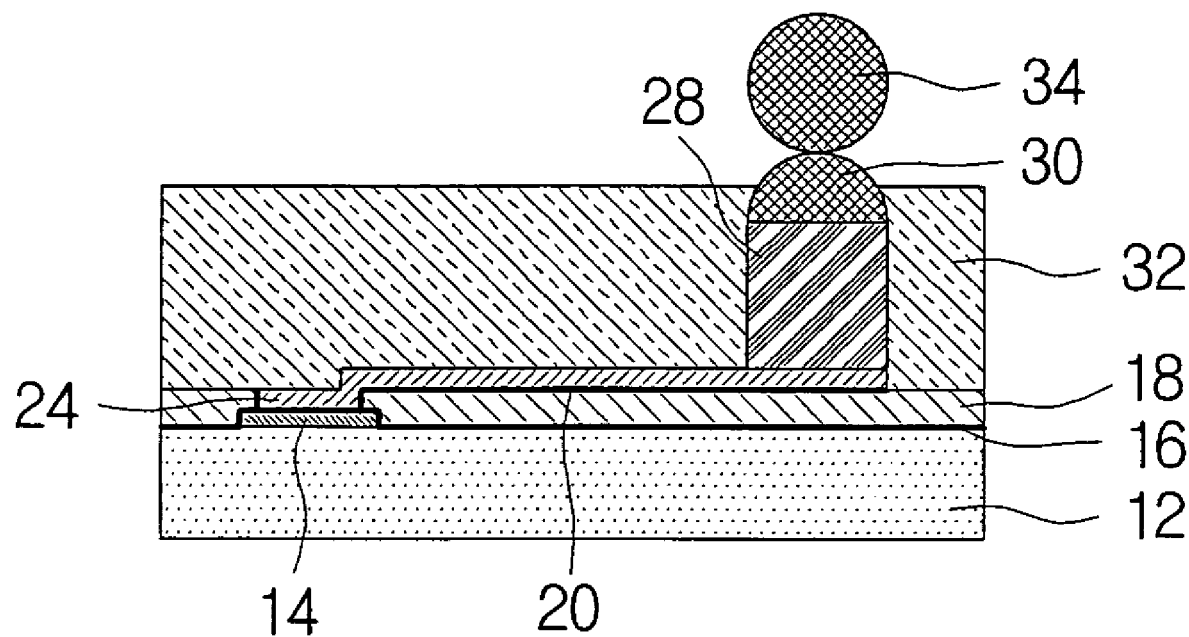
Figure 30:
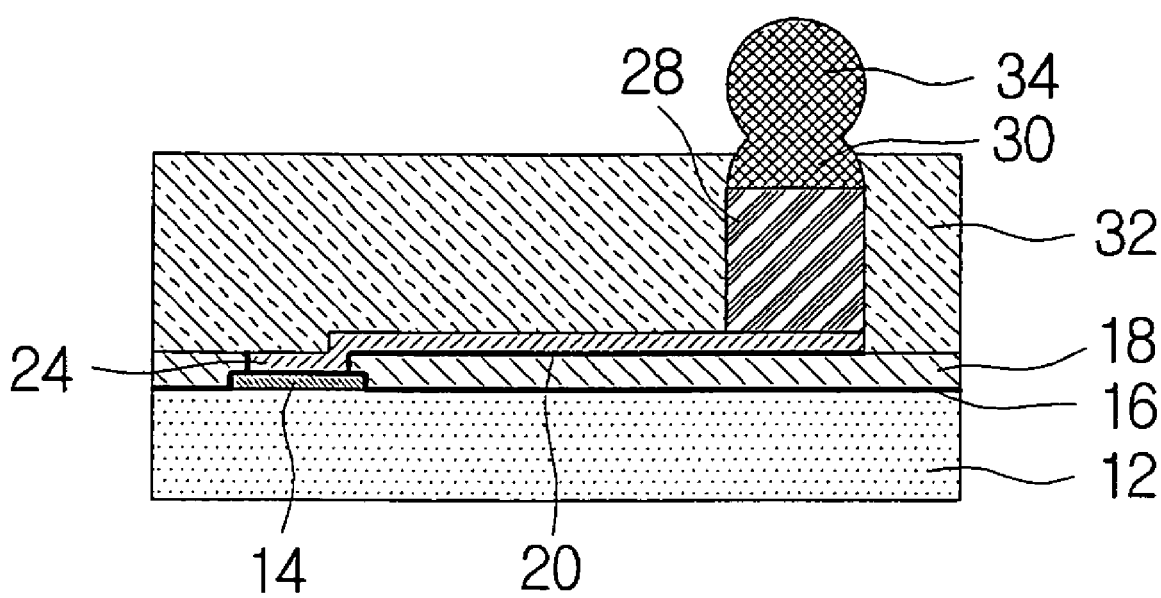

Next, as illustrated in FIG. 29, a solder ball 34 may be formed on the opened second metal pillar 30, and as illustrated in FIG. 30, the solder ball 34 may be reflowed.

Using a reflowed second metal pillar 30, and a solder ball 34 attached over the second metal pillar 30 and reflowed, as described above, a wafer level package can be manufactured which has a high bump height.

As set forth above in certain embodiments of the invention, by forming the rewiring pattern and the metal pillar using one seed layer, the manufacturing process can be simplified, whereby defects during the manufacturing process can be reduced and the reliability of the products can be improved.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a wafer level package, the method comprising:
    coating an insulation layer over one side of a semiconductor chip such that an electrode pad is open, the semiconductor chip having the electrode pad formed on one side;
    forming a seed layer by depositing a conductive metal onto one side of the semiconductor chip;
    forming a rewiring pattern by selective electroplating with the seed layer as an electrode, the rewiring pattern being electrically connected with the electrode pad;
    forming a first metal pillar and a second metal pillar on the first metal pillar by selective electroplating with the seed layer as an electrode, the first metal pillar and the second metal pillar being electrically connected with the rewiring pattern;
    removing portions of the seed layer open to the exterior; then
    reflowing the second metal pillar;
    molding the semiconductor chip with epoxy; and
    opening a portion of the reflowed second metal pillar by performing plasma etching on the molded epoxy.

2. The method of claim 1, wherein the forming of the rewiring pattern comprises:
    stacking a first photosensitive film layer on one side of the semiconductor chip;
    removing a portion of the first photosensitive film layer by selectively exposing and developing the first photosensitive film layer such that an area corresponding to a position where the electrode pad and the rewiring pattern are formed is open;
    performing electroplating with the seed layer as an electrode; and
    removing portions of the first photosensitive film layer remaining on the semiconductor chip.

3. The method of claim 1, wherein the forming of the first metal pillar and the second metal pillar on the first metal pillar comprises:
    stacking a second photosensitive film on one side of the semiconductor chip;
    forming an opening by selectively exposing and developing the second photosensitive film layer to remove a portion of the second photosensitive film layer such that a portion of an area corresponding to a position where the conductive pillar is formed is open;
    forming a first metal pillar by performing electroplating with the seed layer as an electrode such that a portion of the opening is filled;
    forming a second metal pillar by performing electroplating with the seed layer as an electrode such that a remaining portion of the opening is filled; and
    removing the second photosensitive film layer remaining on the semiconductor chip.

4. The method of claim 1, further comprising:
    forming a solder ball on the open portion of the second metal pillar; and
    reflowing the solder ball.

5. The method of claim 1, wherein the first metal pillar is made from copper (Cu), and the second metal pillar is made from tin (Sn).

* * * * *